(12) United States Patent
Blish, II et al.

(10) Patent No.: US 6,768,198 B1
(45) Date of Patent: Jul. 27, 2004

(54) METHOD AND SYSTEM FOR REMOVING CONDUCTIVE LINES DURING DEPROCESSING

(75) Inventors: Richard C. Blish, II, Saratoga, CA (US); Mohammad Massoodi, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 543 days.

(21) Appl. No.: 09/193,193

(22) Filed: Nov. 17, 1998

(51) Int. Cl.$^7$ ............................................. H01L 29/40
(52) U.S. Cl. ..................... 257/751; 257/762; 257/764; 438/619
(58) Field of Search ................................. 438/643, 687, 438/688, 653, 619; 257/751, 762, 764

(56) References Cited

U.S. PATENT DOCUMENTS

| | | | | |
|---|---|---|---|---|
| 5,869,880 A | * | 2/1999 | Grill et al. | |
| 6,090,709 A | * | 7/2000 | Kaloyeros et al. | 438/685 |
| 6,117,769 A | * | 9/2000 | Nogami et al. | 438/653 |
| 6,130,156 A | * | 10/2000 | Havemann et al. | 438/637 |
| 6,136,697 A | * | 10/2000 | Wu | 438/648 |

* cited by examiner

Primary Examiner—Richard Booth
(74) Attorney, Agent, or Firm—Winstead Sechrest & Minick P.C.

(57) ABSTRACT

A system and method for removing a conductive line from a semiconductor device is disclosed. The conductive line includes a conductive layer and a barrier layer separating the conductive layer from a portion of the semiconductor device. The method and system include exposing a portion of the barrier layer, etching the barrier layer after the barrier layer has been exposed, and lifting off the conductive layer after the barrier layer has been etched.

8 Claims, 3 Drawing Sheets

METHOD AND SYSTEM FOR REMOVING CONDUCTIVE LINES DURING DEPROCESSING

FIELD OF THE INVENTION

The present invention relates to deprocessing of semiconductor devices and more particularly to a method and system for removing conductive lines, particularly copper lines.

BACKGROUND OF THE INVENTION

A semiconductor device includes circuitry formed on a semiconductor die. The circuitry in the semiconductor device includes conductive lines. An insulator, such as an interlayer dielectric, typically separates conductive lines in a layer of the semiconductor device. Conductive lines typically include a conductive layer and a barrier layer. In conventional semiconductor devices, the conductive layers are formed of aluminum. In some current semiconductor devices, however, the conductive layers are formed using copper. The barrier layer is provided in order to isolate the conductive layer from a remaining portion of the semiconductor device.

In order to determine locations of faults in the circuitry or otherwise investigate the semiconductor device, deprocessing is performed. Deprocessing removes successive layers of the semiconductor device. After each layer is removed, the remaining portion of the semiconductor device can be investigated.

During deprocessing of the semiconductor device, the conductive lines are removed. The conductive layer is typically etched. The barrier layer is then removed. The insulator is then removed. The remaining portion of the semiconductor device can then be investigated.

Although the conventional method for removing the conductive lines functions, it may be difficult to find a selective etchant that will easily remove the conductive layer. Even if an etchant which can remove the conductive layer can be found, the etchant may also over etch the remaining portions of the semiconductor device. Thus, portions of the semiconductor devices desired to be kept intact for further investigation may be inadvertently removed. Accordingly, what is needed is an alternate system and method for selectively removing conductive lines. The present invention addresses such a need.

SUMMARY OF THE INVENTION

The present invention provides a method and system for removing a conductive line from a semiconductor device. The semiconductor device includes-a barrier layer separating the conductive layer from a portion of the semiconductor device. The method and system comprises exposing a portion of the barrier layer, etching the barrier layer after the barrier layer has been exposed, and lifting off the conductive layer after the barrier layer has been etched.

According to the system and method disclosed herein, the present invention provides a method for removing a conductive line, thereby increasing overall system performance.

DETAILED DESCRIPTION OF THE INVENTION

The present invention relates to an improvement in deprocessing a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein maybe applied to other embodiments. Thus, the present invention is not intended to be limited to the embodiment shown but is to be accorded the widest scope consistent with the principles and features described herein.

Figure 1:
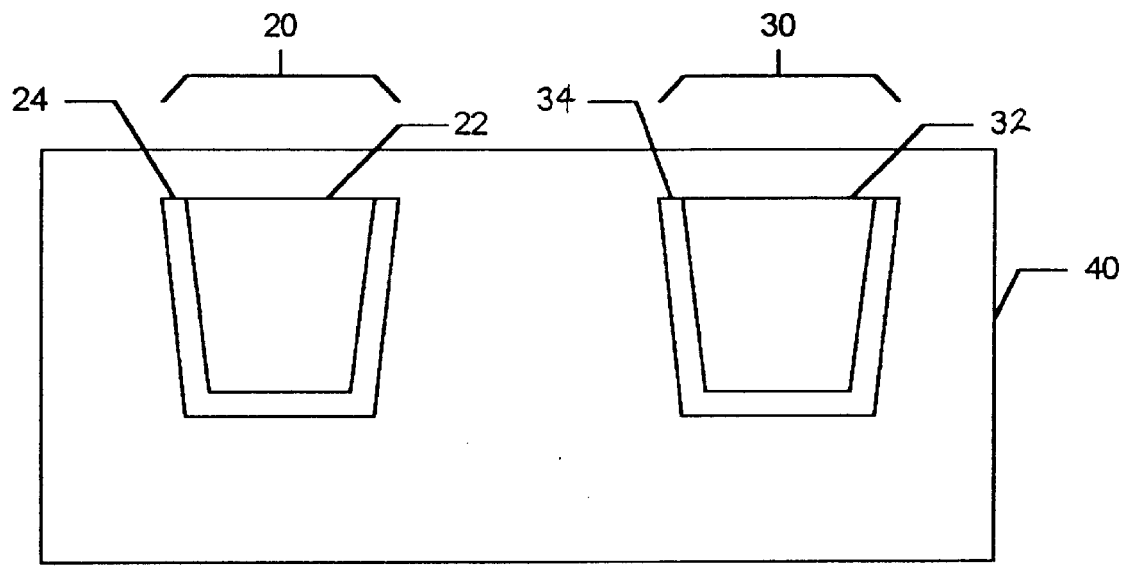
FIG. 1 is a diagram of a pair of conductive lines in a semiconductor device.

FIG. 1 is a block diagram of a portion of a conventional semiconductor device 10. The conventional semiconductor device 10 includes conductive lines 20 and 30. The conductive lines 20 and 30 are separated by an insulator 40. The insulator 40 ensures that the conductive lines 20 are electrically isolated. Typically, the insulator 40 is an interlayer dielectric.

Each of the conductive lines 20 and 30 includes a conductive layer 22 and 32, respectively. The conductive lines 20 and 30 also include a barrier layer 24 and 34, respectively. Typically, the conductive layers 22 and 32 are made from a metal such as aluminum or copper. The barrier layers 24 and 34 may be composed of a bilayer. For example, some barrier layers 24 and 34 include a layer of titanium and a layer of titanium nitride. The titanium nitride typically lies between the titanium and the aluminum or copper. Other barrier layers may include a similarly bilayer of tantalum and tantalum nitride.

Figure 2:
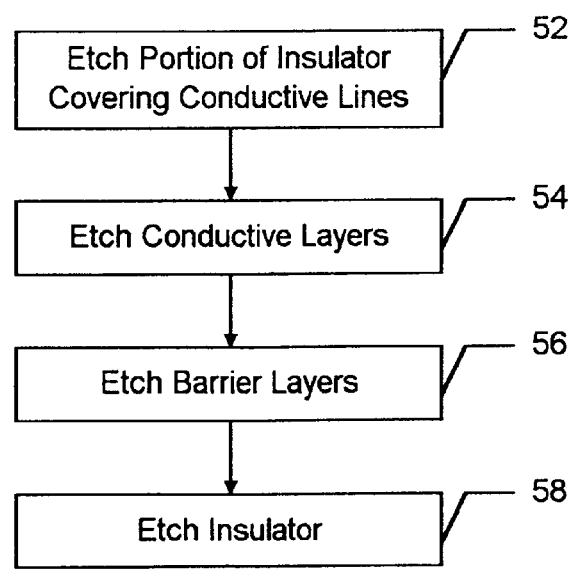
FIG. 2 is a flow chart depicting a conventional method for deprocessing conductive lines.

In order to investigate the semiconductor device, deprocessing may be performed. During deprocessing, the conductive lines 20 and 30 are removed. FIG. 2 depicts a conventional method 50 for removing conductive lines 20 and 30. The portion of the insulator 40 covering the conductive lines 20 and 30 is removed, via step 52; The conductive layers 22 and 32 are then etched. For example, if conductive layers 22 and 32 are copper, a solvent such as nitric acid and water or ammonium per sulfate is used in step 54. The barrier layers 24 and 34 are then etched, via step 56. For example, a solvent including sulfuric acid and hydrogen peroxide may be used to etch barrier layers 24 and 34 composed of titanium and titanium nitride. Similarly, if the barrier layers 24 and 34 include tantalum and tantalum nitride, a solvent include sodium hydroxide and water may be used in step 56. After the etch performed in step 56 has removed the barrier layers, the insulator 40 is removed, via step 58. Thus, the portion of the semiconductor device 10 below the conductive lines 20 and 30 is exposed for further investigation.

Although the method 50 are shown in FIG. 2 functions, those with ordinary skill in the art will realize that it may be difficult to find a solvent that will adequately remove the conductive layers 22 and 32. A solvent which does remove the conductive layers 22 and 32 may over-etch the semiconductor device 10. Thus, portions of the semiconductor device 10 desired to be kept intact for further investigation may be inadvertently removed. The present invention provides a method and system for removing a conductive line from a semiconductor device. The conductive line includes a conductive layer and a barrier layer separating the conductive layer from a portion of the semiconductor device. The method and system comprise exposing a portion of the barrier layer, etching the barrier layer after the barrier layer been exposed, and lifting off the conductive layer after the barrier layer has been etched.

The present invention will be described in terms of particular etchants and processes for removing certain materials. However, one of ordinary skill in the art will readily recognize that this method and system will operate effectively for other etchants and other processes for removing certain materials.

Figure 3:
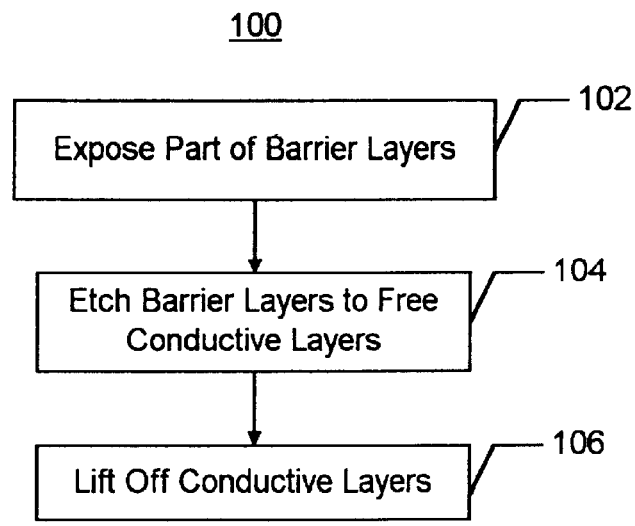
FIG. 3 is a flow chart depicting a method for deprocessing conductive lines in accordance with the present invention.
Figure 4A:
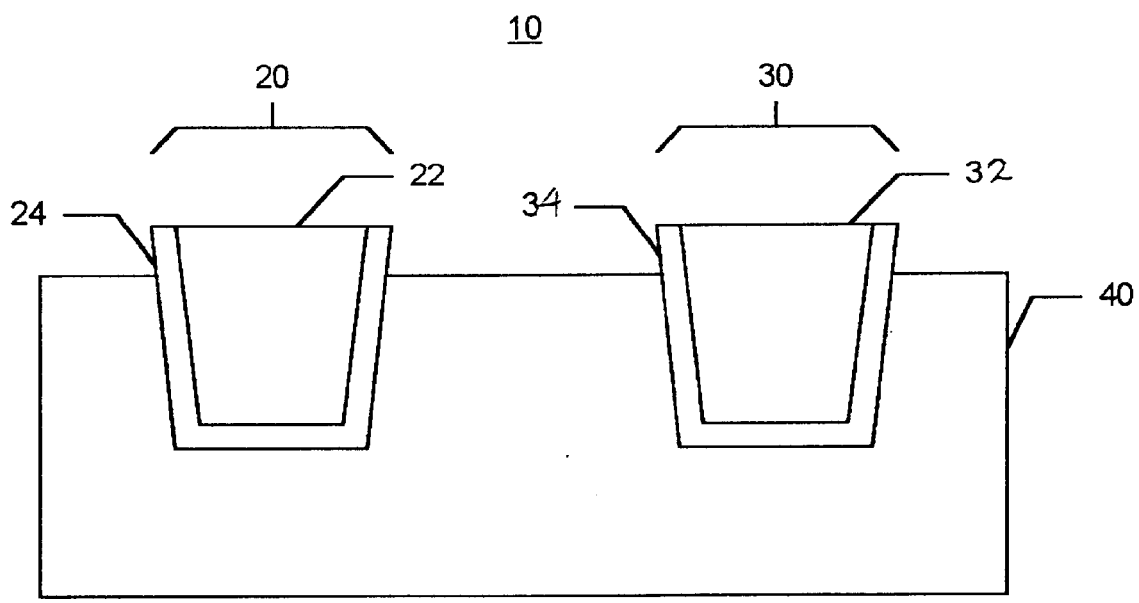
FIG. 4A is a diagram of a pair of conductive lines during deprocessing, after the barrier metal is exposed.

To more particularly illustrate the method and system in accordance with the present invention, refer now to FIG. 3 depicting a flow chart of one embodiment of a method 100 in accordance with the present invention. A portion of each of the barrier layers 24 and 34 are exposed, via step 102. In a preferred embodiment, step 102 is performed by dry etching the insulator 40. Dry etching is preferred because the amount of the insulator 40 removed may be. more easily controlled. FIG. 4A depicts the semiconductor device 10 after step 102 has been performed. Because the insulator 40 has been etched back, portions of the barrier layers 24 and 34 are exposed.

Figure 4B:
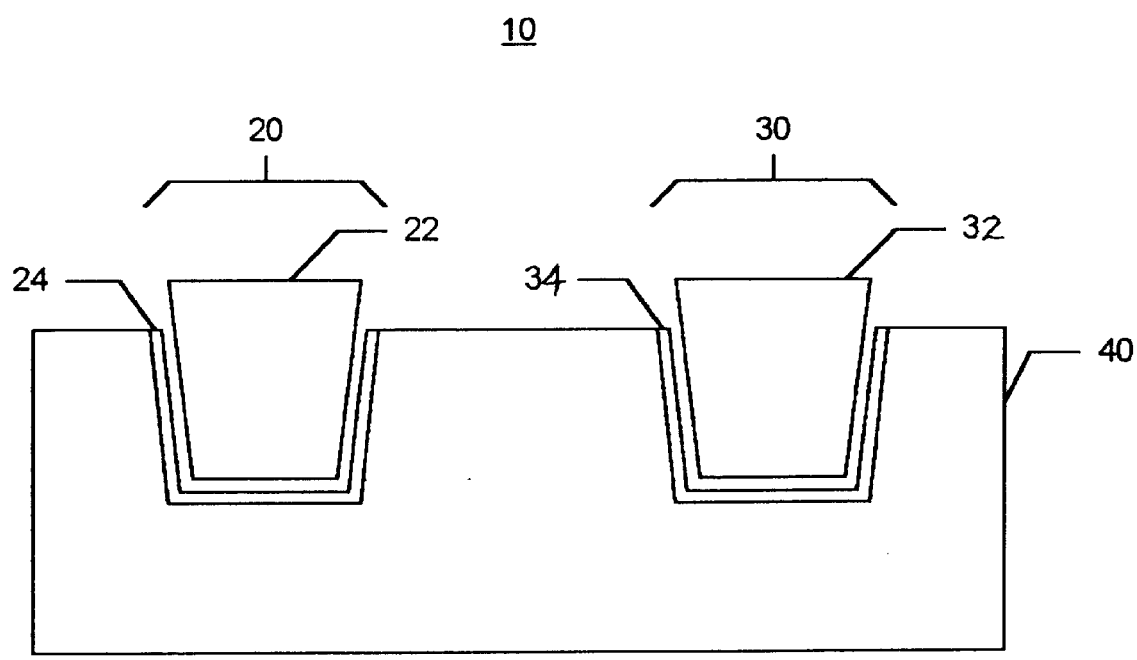
FIG. 4B is a diagram of a pair of conductive lines during deprocessing, after etching of the barrier metal.

Referring to FIG. 3, the barrier layers 24 and 34 are then wet etched, via step 104. In an embodiment where the barrier layers 24 and 34 include a bilayer of titanium and titanium nitride, a solvent including sulfuric acid and hydrogen peroxide may be used. Similarly, if the barrier layers 24 and 34 include tantalum and tantalum nitride, a solvent include sodium hydroxide and water may be used in step 104. Note, however, that the embodiment of the method 100 is preferably not used when the barrier layers 24 and 34 include tantalum and tantalum nitride, because tantalum and tantalum nitride are relatively difficult to etch. In a preferred embodiment, etching in step 104 continues until barrier layers 24 and 34 are substantially completely removed. However, in an alternate embodiment, the etching step 104 is continued until physical contact between the conductive layers 22 and 32 and the barrier layers 24 and 34, respectively is broken. FIG. 4B depicts the semiconductor device 10 after the etching step 104 has been completed. As shown in FIG. 4B, the conductive layers 22 and 32 are no longer held in place by the barrier layers 24 and 34, respectively.

Referring to FIG. 3, once step 104 is completed, the conductive layers 22 and 32 are lifted off, via step 106. Because the conductive layers 22 and 32 are no longer held in place by the barrier layers 24 and 34, respectively, lifting off of the conductive layers 22 and 32 should be relatively simple. Deprocessing of the semiconductor device can then be continued. For example, the insulator 40 can be further etched to expose the portion of the semiconductor device 10 under the conductive lines.

Thus, the conductive layers 22 and 32 are lifted off, rather than etched. The conductive layers 22 and 32 can be lifted off because the barrier layers 24 and 34, respectively, have been etched. Therefore, the conductive layers 22 and 32 and the barrier layers 24 and 34, respectively, can be removed in a single step. In addition, because the method 100 etches the barrier layers 24 and 34 rather than the conductive layers 22 and 32, the method 100 is preferably used for semiconductor devices in which the barrier layers 24 and 34 are more easily etched than the conductive layers 22 and 32. In addition, lifting the conductive layers 22 and 32 during etching the barrier layers 24 and 34 may be a relatively faster deprocessing technique in comparison to etching both the conductive layers 22 and 32 and the barrier layers 24 and 34 using the conventional method 10 depicted in FIG. 2. Moreover, if an adequate, controllable mechanism for etching the conductive layers 22 and 32 is not available, the method 100 provides additional advantages. In particular, etching the barrier layers 24 and 34 and lifting off the conductive layers 22 and 32 may prevent over etching of the insulator 40. Thus, the portions of the semiconductor device 10 desired to be investigated are preserved.

A method and system has been disclosed for removing conductive lines in a semiconductor device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device that is at least partially deprocessed, the semiconductor device comprising:

at least one conductive line including a conductive layer; and an insulator surrounding a portion of the conductive line, the insulator being separated from the conductive layer by a gap, the gap being formed by removal of a portion of a barrier layer disposed between the conductive layer and the insulator, the portion of the barrier layer being removed by exposing a second portion of the barrier layer by removing a portion of the insulator; and etching the portion barrier layer after the portion of the insulator is removed; and wherein the conductive line is physically detached from the insulator and is capable of being removed by lifting off the conductive layer.

2. The semiconductor device of claim 1 wherein the conductive layer includes copper.

3. The semiconductor device of claim 1 wherein the barrier layer includes a layer of titanium and a layer of titanium nitride, the layer of titanium nitride being substantially above the layer of titanium.

4. The semiconductor device of claim 3 wherein the portion of the barrier layer is etched using a solvent including hydrogen peroxide and sulfuric acid.

5. The semiconductor device of claim 1 wherein the barrier layer includes a layer of tantalum and a layer of tantalum nitride, the layer of tantalum nitride being substantially above the layer of tantalum.

6. The semiconductor device of claim 5 wherein the portion of the barrier layer is etched using a solvent including hydrofluoric acid, nitric acid, and water.

7. The semiconductor device of claim 1 wherein the second portion of the barrier layer is exposed by etching the portion of the insulator.

8. The semiconductor device of claim 1 wherein the portion of the barrier layer further includes all of the barrier layer.

* * * * *

UNITED STATES PATENT AND TRADEMARK OFFICE
CERTIFICATE OF CORRECTION

PATENT NO.   : 6,768,198 B1
DATED        : July 27, 2004
INVENTOR(S)  : Richard C. Blish, II and Mohammad Massoodi It is certified that error appears in the above-identified patent and that said Letters Patent is hereby corrected as shown below:

Column 2,
Line 16, please replace "maybe" with -- may be --.
Line 43, following "52" please replace ";" with -- . --.

Column 3,
Line 22, following "be" please delete ".".

Signed and Sealed this

Twenty-third Day of November, 2004

JON W. DUDAS
*Director of the United States Patent and Trademark Office*